June 15, 1971 H. KOELMANS 3,585,071

METHOD OF MANUFACTURING A SEMICONDUCTOR DEVICE INCLUDING A SEMICONDUCTOR MATERIAL OF THE AII BVI TYPE, AND SEMICONDUCTOR DEVICE MANUFACTURED BY THIS METHOD

Filed Aug. 14, 1967 5 Sheets-Sheet 1

INVENTOR.
HEIN KOELMANS
BY
AGENT

June 15, 1971 H. KOELMANS 3,585,071

METHOD OF MANUFACTURING A SEMICONDUCTOR DEVICE INCLUDING A SEMICONDUCTOR MATERIAL OF THE AII BVI TYPE, AND SEMICONDUCTOR DEVICE MANUFACTURED BY THIS METHOD

Filed Aug. 14, 1967 5 Sheets-Sheet 2

INVENTOR.
HEIN KOELMANS

BY

Frank R. Trifari

AGENT

June 15, 1971 H. KOELMANS 3,585,071

METHOD OF MANUFACTURING A SEMICONDUCTOR DEVICE INCLUDING A SEMICONDUCTOR MATERIAL OF THE AII BVI TYPE, AND SEMICONDUCTOR DEVICE MANUFACTURED BY THIS METHOD

Filed Aug. 14, 1967 5 Sheets-Sheet 3

INVENTOR.

HEIN KOELMANS

BY

[signature]

AGENT

HEIN KOELMANS INVENTOR.
BY
AGENT

INVENTOR.
HEIN KOELMANS
BY
Frank R. Trifari
AGENT

United States Patent Office 3,585,071

Patented June 15, 1971

3,585,071

METHOD OF MANUFACTURING A SEMICONDUCTOR DEVICE INCLUDING A SEMICONDUCTOR MATERIAL OF THE $A^{II}B^{VI}$ TYPE, AND SEMICONDUCTOR DEVICE MANUFACTURED BY THIS METHOD

Hein Koelmans, Emmasingel, Eindhoven, Netherlands, assignor to U.S. Philips Corporation, New York, N.Y.

Filed Aug. 14, 1967, Ser. No. 660,253
Claims priority, application Netherlands, Aug. 17, 1966, 6611536
Int. Cl. B44d *1/20*
U.S. Cl. 117—200 15 Claims

ABSTRACT OF THE DISCLOSURE

A method of manufacturing a semiconductor device. An insultaing substrate is subjected to zinc or cadmium vapor while maintaining the substrate temperature above the temperature at which zinc or cadmium volatilize. A semiconductive material consisting of a sulfide, selenide or telluride of cadmium, zinc or mercury is then deposited on the substrate. Gold or a gold alloy is deposited to form one or more electrical contacts with the chalcogenide material.

This invention relates to a method of manufacturing a semiconductor device including a semiconductor material of the $A^{II}B^{VI}$ type which is applied to a substrate, and to a semiconductor device manufactured by this method.

The term "semiconductor material of the $A^{II}B^{VI}$ type" is to be understood herein to mean a semiconductor material from a chalcogenide, that is to say sulphide, selenide or telluride, or a mixture or mixed crystal of chalcogenides, of at least one element from the group II–B or the Periodic Table, that is to say zinc, cadmium and/or mercury. Known semiconductor devices in which semiconductor material of the $A^{II}B^{VI}$ type is used are, for example, photo-electric cells, more particularly photoconductive cells, in which the semiconductor material used is more particularly cadmium sulphide, cadmium selenide, or mixtures or mixed crystals of these two cadmium salts. Other known semiconductor devices including semiconductor material of the $A^{II}B^{VI}$ type are field effect transistors and more particularly field effect transistors having at least one gate electrode which is separated from the semiconductor material by an insulating layer or a layer of other material having a large band gap. More particularly for such a field effect transistor, cadmium sulphide or cadmium selenide is used as the semiconductor material. However, the invention is not limited to semiconductor devices of the said special type or to cadmium sulphide or cadmium selenide as the semiconductor material. Other semiconductor materials consisting of compounds of the above-mentioned class are, for example, cadmium telluride, zinc selenide and zinc telluride, while mixed crystals or mixtures of $A^{II}B^{VI}$ compounds are also suitable.

The semiconductor material may be applied to the substrate in various ways. The semiconductor material may, for example, be sintered on the substrate in the form of a powder. Further, the semiconductor material may be vapour deposited on the substrate. However, in principle, other methods are also possible for providing the semiconductor material on the substrate, for example, in the form of a self-supporting body of monocrystalline or sintered semiconductor material.

It has been found that, if semiconductor material of the type $A^{II}B^{VI}$ is applied to a substrate, the properties of the semiconductor material are often not reproducible.

Furthermore the semiconductor devices manufactured often have a poor sensitivity or are found to be unstable, the properties of the semiconductor devices declining in time. More particularly this instability is objectionable to the use of the semiconductor materials concerned in field effect transistors having thin layers of such semiconductor material on a substrate. Such a transistor, which is sometimes referred to as a "thin film transistors," preferably includes cadmium sulphide or cadmium selenide as the semiconductor material, since these materials have substantially no hole conduction and hence are either electron conducting or, if conduction electrons are substantially absent, substantially insulating. It is thus possible to induce a conductive channel at the surface of a substantially insulating semiconductor material by means of a gate electrode separated from the semiconductor material by a thin insulating layer, the current between source and drain electrodes contacting the semiconductor material being controllable by means of a voltage at the gate electrode without the possibility of troublesome leakage current occurring through hole conduction. For this purpose one does not depend upon monocrystalline material and use may advantageously be made of polycrystalline material.

The condition of the surface of the semiconductor material is of considerable influence on the properties of field effect transistors. The condition of the surface of the semiconductor material also influences, although in general to a lesser extent, the properties of other semiconductor devices, such as diodes, photocells, transistors, etc. Now, the difficulty arises that the condition of the semiconductor surface may often vary so that the properties of the relevant semiconductor device are unstable. Further, in the manufacture of semiconductor devices, it is difficult for the condition of the semiconductor surface to be maintained so that, in the case of mass productor, semiconductor devices can be obtained having properties which are reproducible within narrow tolerances and that the loss in this mass production through differences in the surface condition is as low as possible. Another difficulty is that, though in many cases a reasonable stability of a semiconductor device is obtained, this is accompanied by a decline in the favourable properties of the semiconductor device. In fact, more particularly in field effect transistor, the voltage at the gate electrode which is necessary to obtain a beginning in forming a conductive channel between the source and the drain, the so-called "threshold gate voltage," may vary greatly, this threshold gate voltage as measured relative to the source being liable considerably to differ from the zero value. An object of the present invention is inter alia to improve this. It has more particularly for its object to improve the surface properties of the semiconductor material at the side of the substrate.

The invention underlies recognition of the fact that the properties of the semiconductor material on the side adjacent the substrate depend upon the surface condition of the substrate material itself and that by means of a suitable preliminary treatment of the surface of the substrate, this condition may have a favourable effect on the properties of the adjacent semiconductor material which is subsequently applied to the substrate. According to the invention a method of manufacturing a semiconductor device including a semiconductor material of the type $A^{II}B^{VI}$ which is provided on a substrate, is characterized in that prior to providing the semiconductor material, zinc or cadmium is vapour deposited on the surface of the substrate which is maintained at a temperature such that the formation of a continuous layer or visible deposit of the relevant material is prevented on at least one insulating part of the surface of the substrate.

A possible explanation for the favourable effect of the vapour deposition with zinc or cadmium might be attributed to the following: Oxygen, either adsorbed or in a state bonded only in part, is generally present at the surface of the substrate. The amount of this oxygen per unit surface is difficult to control and may vary greatly. By the action of this oxygen on the semiconductive chalcogenide applied, the electrical properties of this chalcogenide may be influenced in an uncontrollable and irreproducible manner. Thus oxygen will usually decrease the electron conduction of the semiconductor materials concerned and, if possible, increase the hole conduction. With semiconductor materials of the class referred to which cannot exhibit hole conduction, oxygen may form trapping centres for electrons which may counter-act the formation of a conductive channel in, for example, field effect transistors. This oxygen might bond zinc or cadmium by the action of the zinc or cadmium vapour on the surface of the substrate. The cadmium or zinc thus bonded will not readily be evaporated due to this bonding. Further cadmium atoms or zinc atoms will immediately evaporate again because of the temperature of the substrate so that no further cadmium layer will be built up after compensation of the oxygen and at most a small amount of cadmium may remain adsorbed at the surface.

However, the explanation given here for the favourable action of the vapour deposition treatment with zinc or cadmium is not decisive for the present invention.

The improvement in properties of the surface of the semiconductor material which is adjacent the substrate is important especially in semiconductor devices provided with electrodes on the side of the substrate. On its side to be covered with the semiconductor material, the substrate preferably consists of an insulating material on which at least one electrode has previously been formed. Now, it is advantageously possible to make use of the zinc or the cadmium for obtaining electrodes of specific properties, more specifically electrodes having a low transition resistance for the transition of electrons from and to the semiconductor material. For at least one of the electrodes previously formed, use is preferably made of a material in which the zinc or the cadmium dissolved at the temperature used for the substrate. Very suitable electrode materials for this purpose are gold and alloys on the basis of gold. Such electrodes are preferably formed by vapour deposition.

The method according to the invention is suitable especially for the manufacture of field-effect transistors. To this end, at least one gate electrode is preferably formed on an insulating substrate and subsequently covered with an insulating layer, followed by the vapour deposition of zinc or cadmium. Various materilas may in priciple be used for the insulating layer. A very suitable material has been found to be aluminum oxide. The or a gate electrode is then preferably formed by vapour deposition of aluminum, whereafter the insulating layer is formed by oxidising the aluminium.

In a field effect transistor and more particularly in a field effect transistor having a thin layer of semiconductor material it is in principle possible to form source and drain on the side of the semiconductor material opposite to that where the or a gate electrode is present, but if the latter is formed on the insulating substrate it is preferred to provide the source and drain electrodes on the surface of the substrate, preferably by vapour deposition. The last-mentioned electrodes are preferably provided prior to the vapour deposition of zinc or cadmium and are preferably formed of materials which can absorb cadmium or zinc during the vapour deposition at the temperature of the substrate, as has been explained hereinbefore.

It should be noted that in the co-pending patent application, Ser. No. 660,332, filed Aug. 14, 1967 it has been suggested that the electrode material for semiconductors of the type $A^{II}B^{VI}$ should be an alloy on the basis of gold which contains indium and/or gallium as well as cadmium and/or zinc. Such an alloy has been found to be very advantageous for contacts on $A^{II}B^{VI}$ semiconductors. These contacts more particularly have a low transition resistance for negative charge carriers (electrons) from and to the semiconductor. Such contacts may be formed on a substrate before the semiconductor is provided.

By using the method according to the invention it is sufficient locally to provide on the substrate at first an alloy of gold with indium and/or gallium and then to carry out the vapour deposition of cadmium or zinc at a temperature of the substrate at which the zinc or cadmium diffuses into the gold alloy, without a visible zinc or cadmium deposit forming on those parts of the surface which are not covered with the gold alloy. Suitable temperature for the substrate in the present case are, for example, between 150° C. and 200° C. Favourable properties of the insulating surface parts as well as electrodes of compositions having very favourable contact properties are thus obtained in one operation.

It is to be noted that, due to the high solubility of cadmium and zinc in gold, the content of indium and/or gallium may in practice remain low and more particularly need not be higher than 3 at. percent. An additional advantage is obtained if such an electrode to be made from the gold alloy is provided in a desired shape with the aid of a lacquer layer or wax layer on the substrate in the form of a negative pattern of the electrode to be formed, whereafter the electrode material is vapour deposited and, by dissolving the lacquer layer or wax layer, the material vapour deposited thereon is also removed. The lacquer used may be a photosensitive lacquer, more generally termed "photoresist," in order to obtain a desired pattern of the lacquer with the aid of an optical image.

In order to ensure that, when using a negative wax or lacquer pattern and vapour deposition of the metal, the metal deposited on the lacquer or wax layer is also readily removed upon treatment with the solvent for the lacquer or wax, while retaining the desired pattern of the metal on the surface parts of the substrate which have not been covered with the wax or the lacquer, it is desirable that the deposited metal layer should not be unduly hard. Pure gold is a comparatively soft metal, but when alloyed with other metals its hardness generally increases. However, if the amount of indium or gallium added to the gold is not excessive, the hardness is not yet such that the method described hereinbefore for locally providing the metal layer causes difficulty. The hardness will increase considerably if zinc or cadmium is added, but this addition by means of the vapour deposition treatment then takes place after the electrode has been given its desired shape and the redundant parts of the layer have been removed.

If the vapour deposition is effected with cadmium the substrate is preferably heated to a temperature between 20° C. and 350° C. It is to be noted that for forming a cadmium layer by vapour deposition, it is generally necessary to cool the substrate to, for example, 0° C. or lower. In the present case temperatures for the substrate between 150° C. and 200° C. have been found very suitable in practice.

The invention is preferably used in the manufacture of semiconductor devices having semiconductor material consisting of cadmium sulphide or cadmium selenide. More particularly cadmium selenide has the further advantage that it can readily be vapour deposited on a substrate in the form of layers. The two last-mentioned materials have substantially no hole conduction. They are suitable especially for use in photoconductive cells and field effect transistors. It is to be noted further that especially when cadmium selenide is vapour deposited on a heated substrate, an increased supply of cadmium atoms is found to be not injurious to the quality of the cadmium selenide. More particularly the cadmium may thus first be vapour deposited on the heated substrate by evaporation from a cadmium source, whereafter cadmium selenide is deposited on the substrate from a cadmium selenide source while the evaporation of the cadmium still continuous. The deposition of cadmium on the surface of the substrate and the subsequent vapour deposition of the semiconductor are thus combined in an effective manner.

After the semiconductor and the electrodes for the semiconductor device to be manufactured have been provided on the substrate, an annealing treatment is preferably used. In this connection it is to be noted that such annealing treatments of semiconductor devices with an $A^{II}B^{VI}$ compound as a semiconductor are known in themselves. In the case where the vapour deposition treatment with cadmium or zinc has previously taken place, it is found possible to obtain good stability and good reproducibility, low threshold gate voltages being especially obtainable in field effect transistors manufactured by the method according to the invention and more particularly those in which the gate electrode is formed on the substrate.

The annealing treatment is preferably carried out in two steps, the temperature used in the first step being higher than that in the second step. In the first step a temperature between 400° C. and 600° C. is preferably used, and in the second step a lower temperature is used, which preferably lies between 100° C. and 500° C. The duration of the annealing treatment for each of the two steps preferably lies between 1 minute and 1 hour.

If cadmium selenide is used as the semiconductor material, the annealing treatment is preferably carried out at a temperature between 150° C. and 350° C. in the second step.

It is very advantageous during this annealing treatment to employ an oxygen-containing atmosphere, for example, air, at least in the first step. The material at the surface opposite the surface of the semiconductor adjacent the substrate then acquires an increased resistance so that the electrical performance of the semiconductor device is better concentrated on the material located at the surface of the semiconductor which is adjacent the substrate. This is important especially for field-effect transistors having a semiconductor of cadmium sulphide or cadmium selenide in which the electrodes are formed between the substrate and the semiconductor.

The invention also relates to a semiconductor device and more particularly a field effect transistor which has been manufactured with the use of the method according to the invention.

In order that the invention may be readily carried into effect it will now be described in detail, by way of example, with reference to the accompanying diagrammatic drawings, in which:

FIGS. 1, 2, 3, 5, 6, 7, 9 and 10 show sequential stages in cross-section;

FIGS. 4 to 11 are plan views on stages of 6 field effect transistors to be manufactured, corresponding to the stages shown in cross-section in FIGS. 3, 7 and 10 respectively;

By way of example, the manufacture of field effect transistors on a substrate will now be described.

Figure 1:
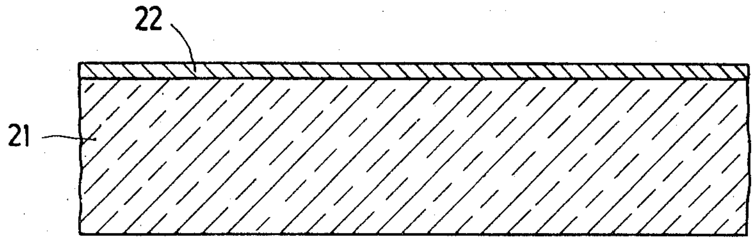
FIGS. 1 to 11 show various stages in the manufacture of field effect transistors.
Figure 2:
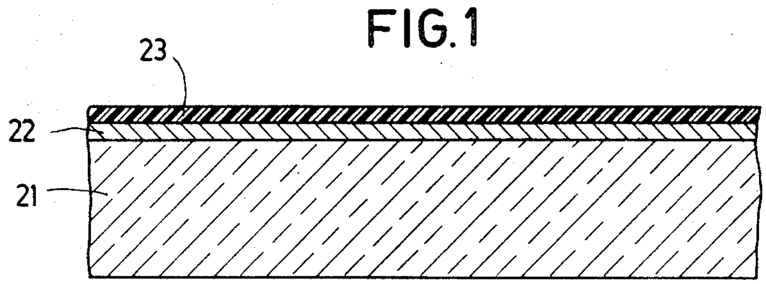
Figure 3:
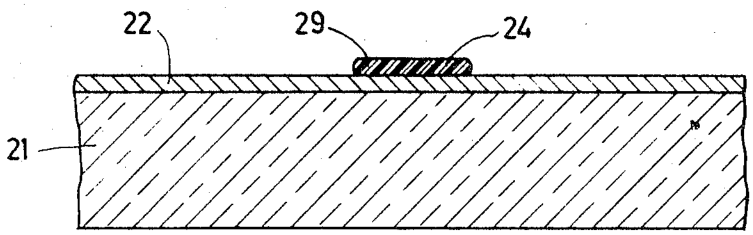
Figure 4:
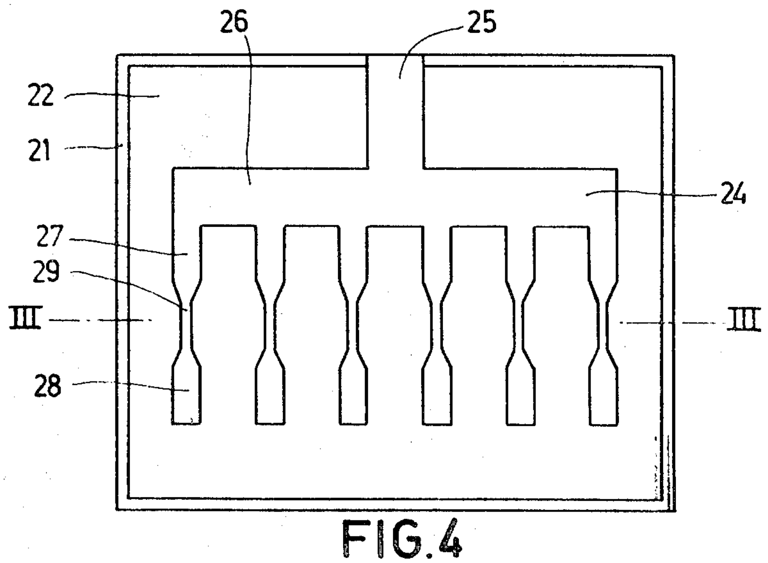
Figure 5:
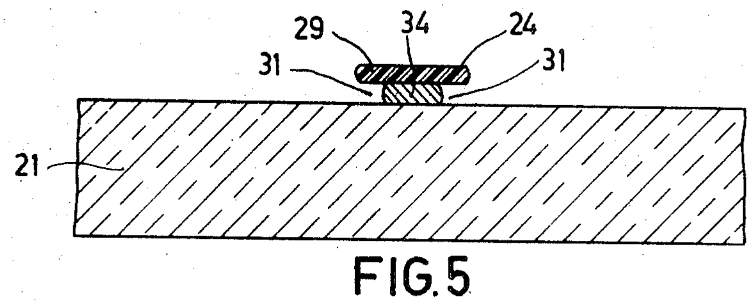
Figure 6:
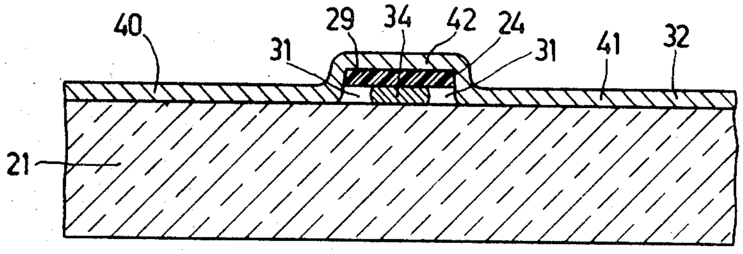

An aluminum layer 22 of approximately 0.1μ thick is vapour deposited on one side of a glass plate 21 (FIG. 1) and then covered with a photoresist layer 23 of approximately 1μ thick. The photoresist chosen in this example is a photoresist which is available commercially under the name "Kalle Kopierlak" (see FIG. 2). By illuminating with ultraviolet radiation using a suitable optional mask and by treatment with a solution of 2% by weight of KOH in water, whereby the exposed parts of the layer 23 are dissolved, an unexposed part 24 of the photoresist (see FIG. 3) remains having the pattern shown in FIG. 4, which comprises a broad strip 25 towards the edge of the glass plate 21 and a comb-shaped part 26 each tooth of which comprises two broader parts 27 and 28 and an intermediate narrow strip 29. Each narrow strip 29 is 2.5 mms. long and 10 microns wide. After washing with deionised water, the whole is subjected to an etching treatment for aluminum. To this end, the plate is immersed in an aqueous solution of orthophosphoric acid, obtained by mixing equal volumes of water and concentrated phosphoric acid (85% by weight of $H_3PO_4$). The etching treatment is carried out at room temperature (20° C.) for 60 minutes, whereafter the glass plate 21 is taken out of the etching liquid and immediately rinsed with deionised water. Not only has the exposed aluminum uncovered by the masking layer 24 disappeared due to the etching treatment, but also a peripheral part 31 of 0.5μ wide located under the mask 24 has been etched away along the edge thereof so that the resulting pattern 34 of the aluminum layer is a little narrower than the pattern 24 of the photoresist layer (see FIG. 5). The whole is subsequently dried at 50° C.

Thereafter an alloy of gold with indium is vapour deposited, starting from a charge of a previously prepared alloy consisting of 1% by weight (approximately 1.7 at. percent) of indium and the balance gold, which charge is evaporated almost completely. A little of chromium is first deposited and then the gold alloy up to a layer thickness of approximately 0.1μ. The chromium ensures more satisfactory adhesion of the gold alloy to the glass surface. By using a suitable deposition mask, several rectangular thin metal layers 32 of 4 mm.x2 mm. are obtained which are separated from one another and extend over the narrow lacquer strips 29 (FFIG. 6). Each gold-indium layer 32 consists of two parts 40 and 41 of substantially square shaped which are adhered to the glass substrate 21, whilst an intermediate part 42 is provided on the photoresistor strip 29. The parts 40 and 41 are separated from the aluminum 24 by a narrow gap 31.

Figure 7:
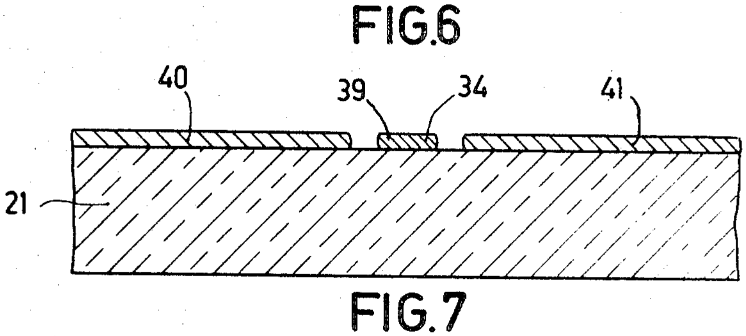
Figure 8:
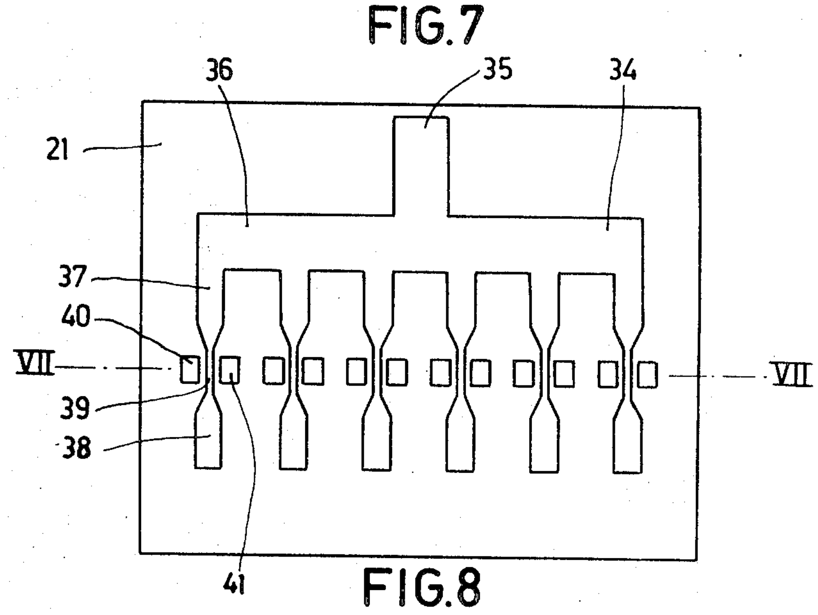

The glass plate is immersed in an acetone bath using ultrasonic vibration. The remaining lacquer layer 24 is dissolved, the gold-indium alloy 42 provided on it then loosening so that only the metal provided on the glass subsists (FIGS. 7 and 8). The pattern of the remaining aluminum layer 34 now comprises a strip 35 and a comb-shaped part 36 each tooth of which comprises two broad parts 37 and 38 connected by a narrow strip 39 which is 2.5 mms. long and 9μ wide. On each side of the narrow strips 39 are the layer parts 40 and 41, respectively, which consist almost completely of gold-indium alloy and are separated from the intermediate strip 39 by a narrow gap of 0.5μ wide obtained by underetching.

Figure 9:
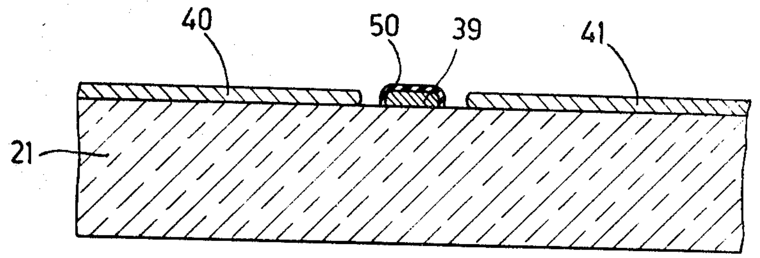

The aluminum is now subjected to an anodically oxidising treatment using an electrolyte bath consisting of a solution of 7.5 gms. of borax and 30 gms. of boric acid per litre of water. A clamping contact is secured to the strip 35 and a platinum electrode is immersed in the electrolyte opposite the side of the glass plate immersed in the electrolyte which is provided with metal layers. The said electrode is biassed as a cathode and the aluminum layer 34 as an anode, an anode voltage of 30 volts relative to the cathode being used. The current strength has decreased to 1μ amp. after approximately half an hour. The electrolytic treatment is now terminated. The glass plate is taken out, rinsed with deionised water, dried, rinsed with isopropyl alcohol and again dried. Due to the anodic treatment of the surface parts of the aluminum which have been exposed to the electrolyte, an aluminum oxide layer 50 has been formed on these parts (see FIG. 9).

Figure 12:
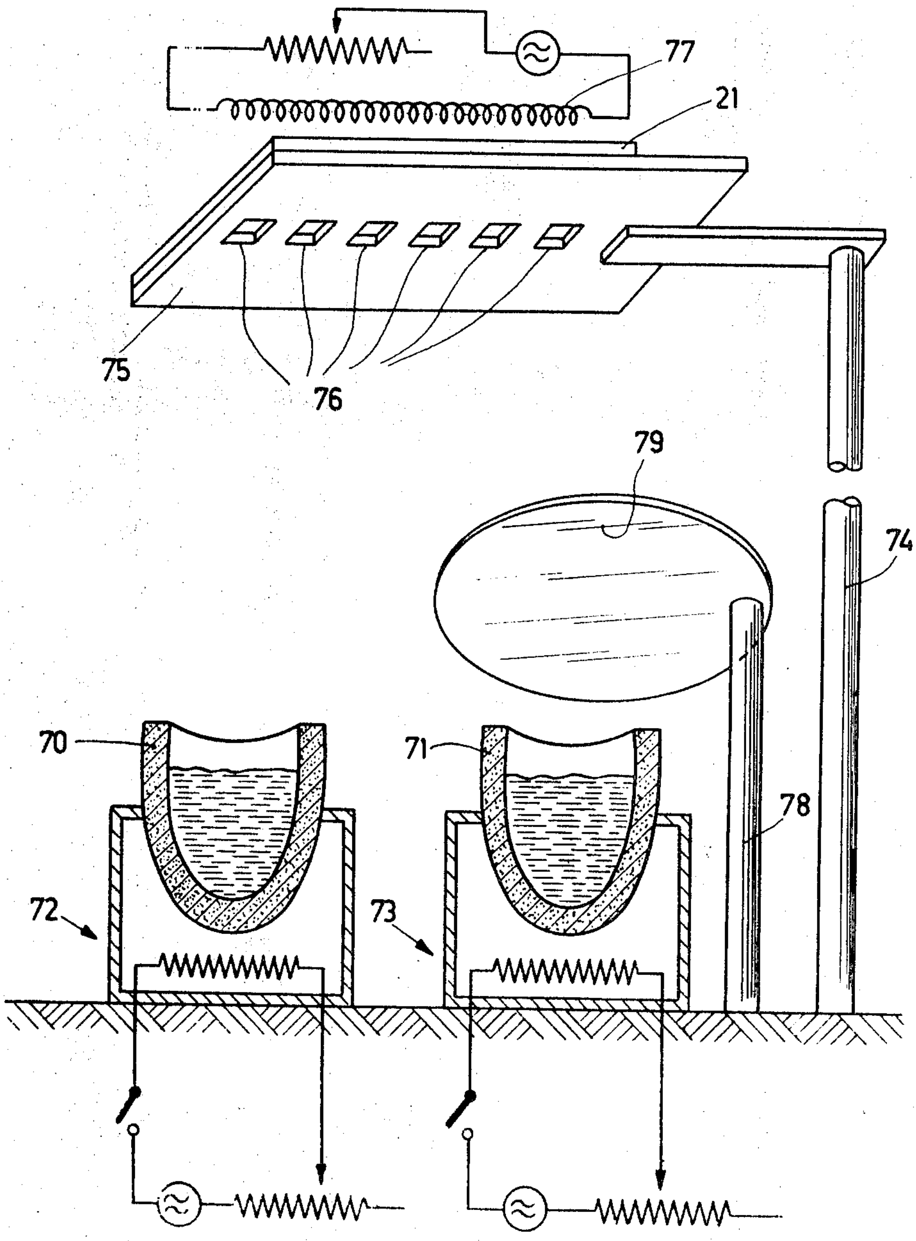
FIG. 12 is an elevational view, partly in vertical section and partly in perspective, of a device used for vapour deposition.

Subsequently the whole is subjected to a vapour deposition treatemnt in vacuo for forming the semiconductor layer. FIG. 12 shows diagrammatically the device employed therefore within a vacuum-bell jar (not shown). Two crucibles 70 and 71 for material to be evaporated, which may be heated by means of resistance furnaces 72 and 73 respectively, are placed in the vacuum-bell jar.

Secured to a support 74 is a vapour deposition mask 75 on which the glass plate 21 is placed with its side provided with electrodes directed downwards. The mask has rectangular apertures 76, the plate 21 being placed on the mask so that part of the layer parts 40 and 41 consisting of the gold-indium alloy and the intermediate narrow strips 39 of electrically oxidised aluminum (see FIG. 8) lie over the apertures 76. A heating element 77 is arranged above the mask 75 and the plate 21 for heating the substrate 21 to the desired temperature during the vapour deposition treatment.

A horizontal screen 79 located over the crucible 71 is secured to a vertical shaft 78, but may be removed from this position by horizontal rotation.

The crucibles 70 and 71 are filled with cadmium and cadmium selenide respectively. The vacuum-bell jar (not shown) is now placed around the crucibles containing the material to be deposited and the object to be coated, whereafter exhaustion takes place. The glass plate 21 is heated to a temperature between 170° C. and 180° C. by means of the heating element 77. Subsequently the crucible 70 is heated to 300° C. by means of the oven 72, so that cadmium evaporates from the crucible and the cadmium vapour acts through the apertures 76 on the surface of the glass plate 21 which carries the electrodes. Since the glass plate 21 has a temperature between 170° C. and 180° C. the cadmium, because of its great volatility, cannot form a cadmium layer on the surface of the substrate to be coated, but it can act upon the free surface of the glass substrate 21 located between the gold-indium layers and of the aluminum oxide layer, so that it can exert influence on locally available surface conditions, and cadmium atoms may be chemically adsorbed, for example, on incompletely bonded oxygen atoms, while possibly cadmium atoms may also be adapted physically. The excess cadmium evaporates from the surface, resulting in a kind of levelling of the properties of the surface which is probably very important for the reproducibility of the manufacture and for the favourable properties of the field-effect transistors manufactured.

Cadmium is also absorbed by the gold-indium alloy into which it rapidly diffuses throughout the gold-indium layer as may be seen from the grey discoloration of the layer on the side of the glass substrate. Sources and drains consisting of an alloy of gold, indium and cadmium are thus obtained for the field effect transistors to be manufactured.

In the meantime the crucible 71 containing the cadmium selenide to be vapour deposited is also heated by means of the oven 73, the screen 79 placed over the crucible 71 still preventing the vapour deposition of cadmium selenide on the plate 21. After the crucible 70 containing the cadmium has been heated at 300° C. for 2 minutes and the local deposition on the plate 21 with electrodes have taken place, the screen 79 is turned away. The crucible 71 has in the meantime been heated to 900° C., during which process cadmium selenide evaporates. Due to the swinging away of the screen 79, the evaporated cadmium selenide has free access to those surface parts of the glass plate 21 covered with electrodes which are accessible through the apertures 76 in the mask 75. The vapour deposition of cadmium selenide and at the same time of cadmium is continued for 1 minute, the temperature of the crucible 71 increased to 1200° C., whereafter the ovens 72 and 73 are switched off and the crucibles 70 and 71 are allowed to cool down. Subsequently the heating of the plate 21 is also stopped and the vacuum eliminated.

Figure 10:
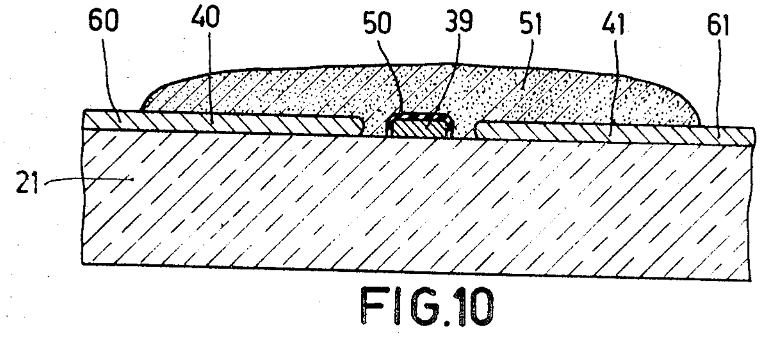
Figure 11:
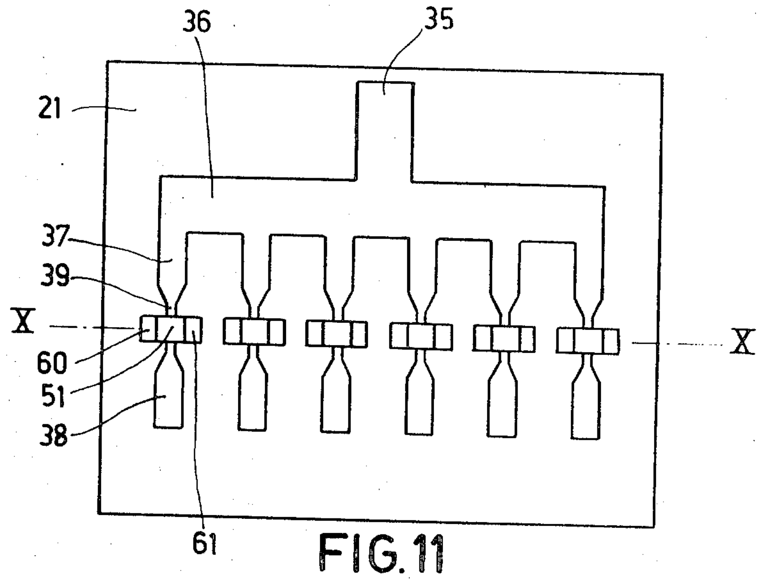

Square layer parts 51 of cadmium selenide have been formed having dimensions of 2 mm. x 2 mm. and 0.2$\mu$ thick, each covering part of the layers 40 and 41 of the gold-indium-cadmium alloy and the intermediate part of the narrow strip 39 of electrically oxidised aluminum. (See FIGS. 10 and 11.)

A plurality of field-effect transistors have thus been formed in which the gold layers 40 and 41 constitute the source and drain electrodes and the aluminum strip 39 constitutes the gate electrode which is insulated from the semiconductor cadmium selenide by the aluminium oxide layer 50.

The exposed parts 60 and 61 of the gold layers 40 and 41, respectively, can serve to make electrical connections to the source and the drain, while the broader parts 37 and/or 38 of the strips may serve for the electrical connection to the gate electrode. The field effect transistors thus formed are now subjected to an annealing treatment. At first the glass plate 21 with the field effect transistosr is heated in air at 500° C. for approximately 3 minutes. This heating at 500° C. causes an increase in the resistance of the semiconductor material, more particularly if it takes place in an oxygen-containing atmosphere, such as air.

Figure 13:
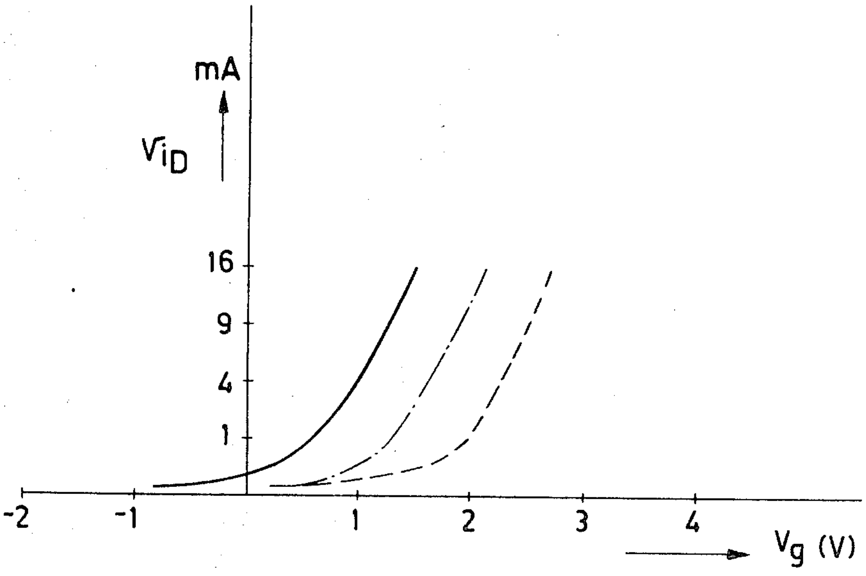
FIG. 13 is a graph showing current-gate voltage characteristics of field effect transistors.

After this treatment, the thereshold gate voltage $V_{go}$, for field effect transistors thus manufactured and treated is found to lie within a range between approximately 1 volt and 1.5 volts. In FIG. 13 the square root of the current strength, $i_D$, is plotted against the gate voltage, $V_g$, for a constant drain voltage. The dot-and-dash curve relates to a field effect transistor immediately after the thermal treatment at 500° C. When the linear portion of the curve is extrapolated towards the abscissa we find the threshold gate voltage $V_{go}$. The relevant dot-and-dash curve relates to a specimen which has a threshold gate voltage $V_{go}$ of approximately 1 volt after the thermal treatment at 500° C. Such a threshold gate voltage is low enough in practice.

Experiments have revealed that the threshold gate voltage is liable to change slightly in time, that is to say is liable to increase, but this increase remains below 1 volt and is in general approximately between 0.5 volt and 0.75 volt. The curve shown in broken line in FIG. 13 relates to such a changed field effect transistor which initially had an $i_D-V_g$ characteristic as shown by the dot-and-dash curve. All the curves relate to the same constant drain voltage. The threshold gate voltage $V_{go}$ has incraesed slightly after ageing and now lies at 1.75 volts.

The treatment step at 500° C. is followed by a second annealing treatment step during which the field effect transistors are subsequently heated in air at a temperature of 300° C. for 3 minutes. It is found not only that the field effect transistors thus have acquired a greater stability but also the threshold gate voltage $V_{go}$ reaches a value of substantially 0 volt (see the full line curve of FIG. 13), that is to say the threshold gate voltage for the transistors manufactured and treated in the manner above described is found to lie between 0 volt and 0.3 volt, which threshold gate voltage during ageing increases by no more than approximately 0.1 volt.

Figure 14:
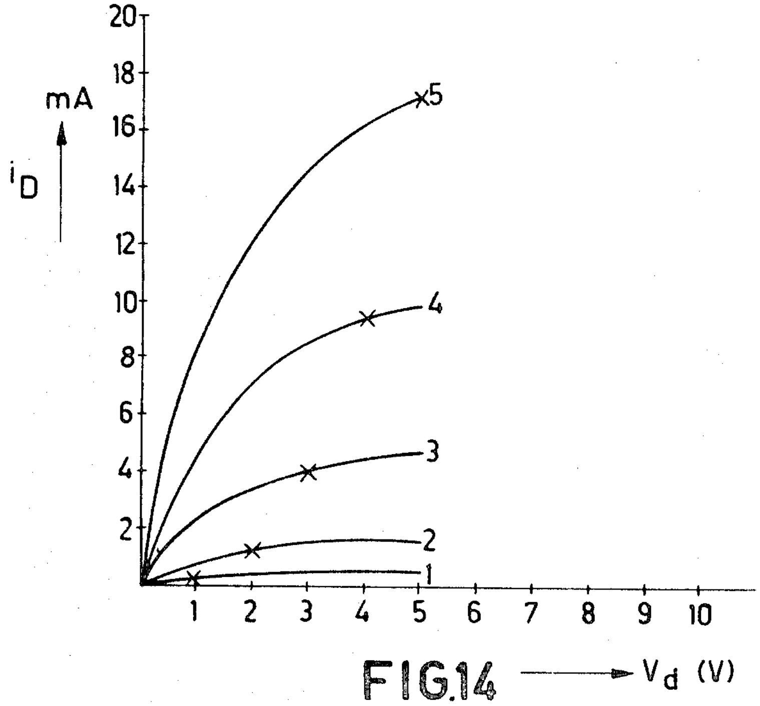
FIG. 14 is a graph showing current-drain voltage characteristics of field effect transistors.

FIG. 14 shows in a graph the current strength, $i_D$, between the source and drain electrodes as a function of the drain voltage for the field effect transistors manufactured in the manner described above, the various curves relating to various (reduced) gate voltages ($V_g-V_{go}$) and sequential curves relating to a variation in gate voltage of 1 volt. The numerals at the end of each curve relate to the constant reduced gate voltage in volts associated with the relevant curve. The crosses on the curves indicate the current strength at $V_D=V_g-V_{go}$, the so-called pinch-off voltage, from which the increase in the current strength, $i_D$, with the drain voltage $V_D$ is only small. The said crosses lie substantially on a parabola which corresponds to a square dependence of $i_D$ upon the pinch-off voltage. Such dependence approximately corresponds to the dependence expected in theory.

With regard to this graph, too, field effect transistors manufactured and treated in the manner above described show a great stability and a good reproducibility. Further, the field effect transistors thus manufactured can satisfactorily be used at high frequencies located between 30 mc./s. and 40 mc./s., while the slope of the current-voltage characteristic is some m.amps per volt for a constant drain voltage, $V_D$, between the source and the drain and a varying reduced gate voltage ($V_g - V_{go}$) on the gate electrode between 0 and 6 volts.

It will be evident that the invention is not limited to the manufacturing method described hereby way of example, but that many variations are possible within the scope of the invention. As regards the vapour deposition, the invention is not confined to cadmium, it also being possible to use zinc which is likewise fairly volatile but to a lesser extent than cadmium. Further, the vapour deposition is not limited to a rectilinear deposition in vacuo but also includes other methods of action of vapour from the relevant metals, for example, vapour of these metals which is passed along the surface of the substrate.

What is claimed is:

1. A method of manufacturing a semiconductor device of the thin film transistor type comprising a chalcogenide material consisting of a sulphide, selenide or telluride, their mixtures and mixed crystals, of at least one element from the group zinc, cadmium and mercury, comprising the steps of forming a gate electrode on an insulating substrate, providing an insulating layer on the gate electrode, vapor depositing zinc or cadmium onto the substrate on at least one insulating surface adjacent the gate electrode while heating the substrate at a temperaure at which the zinc or cadmium volatilizes from the substrate such that no continuous layer or visible deposit of the zinc or cadmium on the insulating surface portion is obtained, thereafter vapor depositing onto the same said substrate insulating surface portion and over the insulated gate electrode the chalcogenide material to form a visible layer, and making source and drain contacts to the chalcogenide layer.

2. A method as set forth in claim 1 wherein the source and drain electrodes are formed on the substrate prior to the zinc or cadmium vapor deposition.

3. A method as set forth in claim 1 wherein the chalcogenide is a cadmium salt, and cadmium is vapor deposited at a temperature between 20° C. and 350° C.

4. A method as set forth in claim 1 wherein the chalcogenide is cadmium selenide, cadmium is vapor deposited, and the vapor deposition of cadmium is continued during the vapor deposition of the cadmium selenide.

5. A method of manufacturing a semiconductor device comprising a chalcogenide material consisting of a sulphide, selenide or telluride, their mixtures and mixed crystals, of at least one element from the group zinc, cadmium and mercury, comprising the steps of providing on an insulating substrate at least one metallic electrode comprising gold leaving adjacent thereto a surface portion free of the electrode and remaining insulating, vapor depositing zinc or cadmium onto the substrate including at least the insulating surface portion while heating the substrate at a temperature between 150° and 200° C. so that the zinc or cadmium volatilizes from the substrate and no continuous layer or visible deposit of the zinc or cadmium on the insulating surface portion is obtained, thereafter vapor depositing onto the same said substrate insulating surface portion and onto the adjacent electrode the chalcogenide material to form a visible layer, and thereafter subjecting the assembly to an annealing treatment by heating above 100° C. in an oxygen-containing atmosphere.

6. A method as claimed in claim 5 wherein the electrode contains indium or gallium in a content of not more than 3 atomic percent.

7. A method as set forth in claim 5 wherein the annealing treatment takes place in two steps, the temperature used in the first step being between 400° and 600° C. and that used in the second step being between 100° and 500° C.

8. A method as set forth in claim 7 wherein a temperature between 100° and 500° C. is used in both steps.

9. A method as set forth in claim 8 wherein the duration of the heating of each of the two steps is between 1 minute and 60 minutes.

10. A method of manufacturing a semiconductor device comprising a chalcogenide material consisting of a sulphide, selenide or telluride, their mixtures and mixed crystals, of at least one element from the group zinc, cadmium and mercury, comprising the steps of vapor depositing zinc or cadmium onto a substrate having at least one insulating surface portion while heating the substrate at a temperature at which the zinc or cadmium volatilizes from the substrate such that no continuous layer or visible deposit of the zinc or cadmium on the insulating surface portion is obtained, thereafter depositing onto the same said substrate insulating surface portion the chalcogenide material to form a visible layer, and making contacts to form electrical connections to the chalcogenide layer.

11. A method as set forth in claim 10 wherein the substrate is heated at a temperature between 150° C. and 200° C.

12. A method as set forth in claim 10 wherein, following the deposition of the chalcogenide layer, it is subjected to an annealing treatment by heating same at an annealing temperature.

13. A method as set forth in claim 10 wherein prior to the zinc or cadmium vapor deposition, a portion of the substrate surface adjacent the insulating material is provided with a metallic electrode, and the chalcogenide layer is deposited over the electrode.

14. A method as set forth in claim 13 wherein the electrode is constituted of a material in which zinc or cadmium dissolves at the temperature at which the substrate is heated during the zinc or cadmium vapor deposition step.

15. A method as set forth in claim 13 wherein the electrode is of gold or a gold alloy.

References Cited

UNITED STATES PATENTS

| | | | |
|---|---|---|---|
| 2,938,816 | 5/1960 | Günther | 117—106X |
| 3,209,450 | 10/1965 | Klein et al. | 317—234/5.2UX |
| 3,298,863 | 1/1967 | McCusker | 117—93.3X |
| 3,391,354 | 7/1968 | Ohashi et al. | 317—235/21.1UX |

ALFRED L. LEAVITT, Primary Examiner

C. K. WERFFENBACH, Assistant Examiner

U.S. Cl. X.R.

29—589; 117—106, 107, 211, 213, 217